(12) United States Patent
Yu et al.

(10) Patent No.: US 9,508,666 B2
(45) Date of Patent: Nov. 29, 2016

(54) PACKAGING STRUCTURES AND METHODS WITH A METAL PILLAR

(71) Applicant: Taiwan Semiconductor Manufacturing Company, Ltd., Hsin-Chu (TW)

(72) Inventors: Chen-Hua Yu, Hsin-Chu (TW); Shin-Puu Jeng, Hsin-Chu (TW); Shang-Yun Hou, Jubei (TW); Kuo-Ching Hsu, Chung-Ho (TW); Cheng-Chieh Hsieh, Yongkang District (TW); Ying-Ching Shih, Taipei (TW); Po-Hao Tsai, Zhongli (TW); Cheng-Lin Huang, Hsin-Chu (TW); Jing-Cheng Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 67 days.

(21) Appl. No.: 14/045,578

(22) Filed: Oct. 3, 2013

(65) Prior Publication Data

US 2014/0038405 A1 Feb. 6, 2014

Related U.S. Application Data

(63) Continuation of application No. 13/298,046, filed on Nov. 16, 2011, now Pat. No. 8,610,285.

(60) Provisional application No. 61/491,301, filed on May 30, 2011.

(51) Int. Cl.
*H01L 23/00* (2006.01)
*H01L 23/14* (2006.01)
(Continued)

(52) U.S. Cl.
CPC ............. *H01L 24/11* (2013.01); *H01L 23/147* (2013.01); *H01L 24/13* (2013.01); *H01L 24/16* (2013.01);
(Continued)

(58) Field of Classification Search
CPC ..... H01L 23/147; H01L 24/11; H01L 24/13; H01L 24/16; H01L 25/04
See application file for complete search history.

(56) References Cited

U.S. PATENT DOCUMENTS

| 3,996,034 A | 12/1976 | Taylor et al. |
| 4,811,082 A | 3/1989 | Jacobs et al. |

(Continued)

FOREIGN PATENT DOCUMENTS

| CN | 1901198 A | 1/2007 |
| CN | 101740417 A | 6/2016 |

(Continued)

OTHER PUBLICATIONS

Lin, T.H., et al., "Electromigration Study of Micro Bumps at Si/Si Interface in 3DIC Package for 28nm Technology and Beyond," IEEE Electronic Components and Technology Conference, May 31-Jun. 3, 2011, pp. 346-350.

(Continued)

*Primary Examiner* — Minh-Loan Tran
*Assistant Examiner* — Farid Khan
(74) *Attorney, Agent, or Firm* — Slater Matsil, LLP

(57) ABSTRACT

A package component is free from active devices therein. The package component includes a substrate, a through-via in the substrate, a top dielectric layer over the substrate, and a metal pillar having a top surface over a top surface of the top dielectric layer. The metal pillar is electrically coupled to the through-via. A diffusion barrier is over the top surface of the metal pillar. A solder cap is disposed over the diffusion barrier.

17 Claims, 3 Drawing Sheets

(51) Int. Cl.
*H01L 25/04* (2014.01)
*H01L 25/00* (2006.01)
*H01L 23/498* (2006.01)

(52) U.S. Cl.
CPC .............. *H01L 25/04* (2013.01); *H01L 25/50* (2013.01); *H01L 23/49827* (2013.01); *H01L 24/81* (2013.01); *H01L 2224/0361* (2013.01); *H01L 2224/03912* (2013.01); *H01L 2224/0401* (2013.01); *H01L 2224/05022* (2013.01); *H01L 2224/05027* (2013.01); *H01L 2224/05073* (2013.01); *H01L 2224/05124* (2013.01); *H01L 2224/05139* (2013.01); *H01L 2224/05144* (2013.01); *H01L 2224/05147* (2013.01); *H01L 2224/05155* (2013.01); *H01L 2224/05184* (2013.01); *H01L 2224/05666* (2013.01); *H01L 2224/05681* (2013.01); *H01L 2224/05686* (2013.01); *H01L 2224/10145* (2013.01); *H01L 2224/10156* (2013.01); *H01L 2224/1146* (2013.01); *H01L 2224/1147* (2013.01); *H01L 2224/1182* (2013.01); *H01L 2224/11831* (2013.01); *H01L 2224/13017* (2013.01); *H01L 2224/13082* (2013.01); *H01L 2224/13083* (2013.01); *H01L 2224/13111* (2013.01); *H01L 2224/13147* (2013.01); *H01L 2224/13155* (2013.01); *H01L 2224/13164* (2013.01); *H01L 2224/13565* (2013.01); *H01L 2224/13578* (2013.01); *H01L 2224/13686* (2013.01); *H01L 2224/16058* (2013.01); *H01L 2224/16145* (2013.01); *H01L 2224/81193* (2013.01); *H01L 2224/81815* (2013.01); *H01L 2924/01322* (2013.01); *H01L 2924/01327* (2013.01)

(56) References Cited

U.S. PATENT DOCUMENTS

| | | | |
|---|---|---|---|
| 4,990,462 A | 2/1991 | Sliwa, Jr. | |
| 5,075,253 A | 12/1991 | Sliwa, Jr. | |
| 5,194,403 A | 3/1993 | Delage et al. | |
| 5,313,371 A | 5/1994 | Knecht et al. | |
| 5,334,804 A | 8/1994 | Love et al. | |
| 5,380,681 A | 1/1995 | Hsu | |
| 5,481,133 A | 1/1996 | Hsu | |
| 6,002,177 A | 12/1999 | Gaynes et al. | |
| 6,051,190 A | 4/2000 | Birch et al. | |
| 6,187,678 B1 | 2/2001 | Gaynes et al. | |
| 6,218,281 B1 | 4/2001 | Watanabe et al. | |
| 6,229,216 B1 | 5/2001 | Ma et al. | |
| 6,229,220 B1 | 5/2001 | Saitoh et al. | |
| 6,236,115 B1 | 5/2001 | Gaynes et al. | |
| 6,271,059 B1 | 8/2001 | Bertin et al. | |
| 6,279,815 B1 | 8/2001 | Correia et al. | |
| 6,355,501 B1 | 3/2002 | Fung et al. | |
| 6,392,163 B1 | 5/2002 | Rinne et al. | |
| 6,434,016 B2 | 8/2002 | Zeng et al. | |
| 6,448,661 B1 | 9/2002 | Kim et al. | |
| 6,461,895 B1 | 10/2002 | Liang et al. | |
| 6,528,109 B1* | 3/2003 | Filev ............... | B05B 12/084 118/313 |
| 6,562,653 B1 | 5/2003 | Ma et al. | |
| 6,570,248 B1 | 5/2003 | Ahn et al. | |
| 6,578,754 B1 | 6/2003 | Tung | |
| 6,592,019 B2 | 7/2003 | Tung | |
| 6,600,222 B1 | 7/2003 | Levardo | |
| 6,607,938 B2 | 8/2003 | Kwon et al. | |
| 6,661,085 B2 | 12/2003 | Kellar et al. | |
| 6,762,076 B2 | 7/2004 | Kim et al. | |
| 6,774,306 B2 | 8/2004 | Smith | |
| 6,790,748 B2 | 9/2004 | Kim et al. | |
| 6,818,545 B2 | 11/2004 | Lee et al. | |
| 6,853,076 B2 | 2/2005 | Datta et al. | |
| 6,887,769 B2 | 5/2005 | Kellar et al. | |
| 6,908,565 B2 | 6/2005 | Kim et al. | |
| 6,908,785 B2 | 6/2005 | Kim | |
| 6,917,119 B2 | 7/2005 | Lee et al. | |
| 6,924,551 B2 | 8/2005 | Rumer et al. | |
| 6,943,067 B2 | 9/2005 | Greenlaw | |
| 6,946,384 B2 | 9/2005 | Kloster et al. | |
| 6,975,016 B2 | 12/2005 | Kellar et al. | |
| 7,008,867 B2 | 3/2006 | Lei | |
| 7,037,804 B2 | 5/2006 | Kellar et al. | |
| 7,056,807 B2 | 6/2006 | Kellar et al. | |
| 7,064,436 B2 | 6/2006 | Ishiguri et al. | |
| 7,087,538 B2 | 8/2006 | Staines et al. | |
| 7,101,781 B2 | 9/2006 | Ho et al. | |
| 7,151,009 B2 | 12/2006 | Kim et al. | |
| 7,157,787 B2 | 1/2007 | Kim et al. | |
| 7,215,033 B2 | 5/2007 | Lee et al. | |
| 7,276,799 B2 | 10/2007 | Lee et al. | |
| 7,279,795 B2 | 10/2007 | Periaman et al. | |
| 7,307,005 B2 | 12/2007 | Kobrinsky et al. | |
| 7,317,256 B2 | 1/2008 | Williams et al. | |
| 7,320,928 B2 | 1/2008 | Kloster et al. | |
| 7,345,350 B2 | 3/2008 | Sinha | |
| 7,391,112 B2 | 6/2008 | Li et al. | |
| 7,402,442 B2 | 7/2008 | Condorelli et al. | |
| 7,402,515 B2 | 7/2008 | Arana et al. | |
| 7,410,884 B2 | 8/2008 | Ramanathan et al. | |
| 7,432,592 B2 | 10/2008 | Shi et al. | |
| 7,494,845 B2 | 2/2009 | Hwang et al. | |
| 7,498,119 B2 | 3/2009 | Limb et al. | |
| 7,528,494 B2 | 5/2009 | Furukawa et al. | |
| 7,531,890 B2 | 5/2009 | Kim | |
| 7,557,597 B2 | 7/2009 | Anderson et al. | |
| 7,576,435 B2 | 8/2009 | Chao | |
| 7,687,311 B1 | 3/2010 | Lee et al. | |
| 7,816,743 B2 | 10/2010 | Furukawa et al. | |
| 7,834,450 B2 | 11/2010 | Kang | |
| 7,863,739 B2 | 1/2011 | Lee et al. | |
| 8,159,070 B2 | 4/2012 | Lin et al. | |
| 8,232,193 B2 | 7/2012 | Chang | |
| 8,242,011 B2 | 8/2012 | Lim et al. | |
| 8,349,721 B2 | 1/2013 | Shim et al. | |
| 8,610,285 B2 | 12/2013 | Yu et al. | |
| 8,637,392 B2 | 1/2014 | Arvin et al. | |
| 8,664,760 B2 | 3/2014 | Yu et al. | |
| 2002/0090805 A1 | 7/2002 | Yap et al. | |
| 2002/0117330 A1 | 8/2002 | Eldridge et al. | |
| 2002/0166688 A1 | 11/2002 | Smith | |
| 2003/0006062 A1* | 1/2003 | Stone et al. ................. | 174/255 |
| 2003/0155408 A1* | 8/2003 | Fanti ................... | H01L 21/2885 228/215 |
| 2004/0007779 A1 | 1/2004 | Arbuthnot et al. | |
| 2004/0096697 A1 | 5/2004 | Tai et al. | |
| 2004/0166661 A1* | 8/2004 | Lei ........................... | H01L 24/03 438/614 |
| 2005/0062169 A1* | 3/2005 | Dubin et al. ................. | 257/779 |
| 2005/0239277 A1* | 10/2005 | Mercer .................. | H01L 24/11 438/614 |
| 2007/0004121 A1 | 1/2007 | Eckstein et al. | |
| 2008/0048320 A1 | 2/2008 | Lee et al. | |
| 2008/0081464 A1* | 4/2008 | Matsuda ........... | H01L 21/02063 438/660 |
| 2008/0185716 A1 | 8/2008 | Huang | |
| 2008/0194095 A1* | 8/2008 | Daubenspeck et al. ...... | 438/612 |
| 2008/0246151 A1 | 10/2008 | Yang et al. | |
| 2010/0109159 A1* | 5/2010 | Ho .......................... | H01L 24/11 257/737 |
| 2010/0132998 A1 | 6/2010 | Lee et al. | |
| 2010/0164098 A1 | 7/2010 | Kuechenmeister et al. | |
| 2010/0276787 A1* | 11/2010 | Yu et al. ....................... | 257/621 |
| 2010/0330798 A1 | 12/2010 | Huang et al. | |
| 2011/0006416 A1 | 1/2011 | Tseng et al. | |
| 2011/0049705 A1* | 3/2011 | Liu ......................... | H01L 24/11 257/737 |
| 2011/0049716 A1* | 3/2011 | Yang .................... | C23C 16/0272 257/751 |
| 2011/0084381 A1* | 4/2011 | Lo ........................... | H01L 24/11 257/737 |

(56) References Cited

U.S. PATENT DOCUMENTS

| | | | |
|---|---|---|---|
| 2011/0101519 A1* | 5/2011 | Hsiao | H01L 23/49827 257/737 |
| 2011/0101526 A1* | 5/2011 | Hsiao | H01L 23/49816 257/738 |
| 2011/0193218 A1* | 8/2011 | Arvin | H01L 23/49811 257/737 |
| 2011/0254161 A1* | 10/2011 | Hu | 257/738 |
| 2011/0266667 A1 | 11/2011 | Wu et al. | |
| 2011/0298123 A1 | 12/2011 | Hwang et al. | |
| 2011/0304042 A1 | 12/2011 | Lin et al. | |
| 2012/0007228 A1 | 1/2012 | Lu et al. | |
| 2012/0007231 A1 | 1/2012 | Chang | |
| 2012/0043654 A1 | 2/2012 | Lu et al. | |
| 2012/0061823 A1 | 3/2012 | Wu et al. | |
| 2012/0091577 A1 | 4/2012 | Hwang et al. | |
| 2012/0193785 A1 | 8/2012 | Lin et al. | |
| 2012/0267781 A1 | 10/2012 | Lu et al. | |
| 2014/0131864 A1 | 5/2014 | Yu et al. | |

FOREIGN PATENT DOCUMENTS

| | | |
|---|---|---|
| JP | 05335313 | 12/1993 |
| JP | 2000228420 | 8/2000 |

OTHER PUBLICATIONS

Wei, C.C., et al., "Comparison of the Electromigration Behaviors Between Micro-bumps and C4 Solder Bumps," 2011 Electronic Components and Technology Conference, pp. 706-710.

* cited by examiner

PACKAGING STRUCTURES AND METHODS WITH A METAL PILLAR

This application is a continuation of U.S. patent application Ser. No. 13/298,046, filed on Nov. 16, 2011, and entitled "3D IC Packaging Structures and Methods with a Metal Pillar," which application claims the benefit of U.S. Provisional Application No. 61/491,301, filed on May 30, 2011, and entitled "3DIC Packaging Structures and Methods," which applications are hereby incorporated herein by reference.

BACKGROUND

In the formation of three-dimensional integrated circuits (3DICs), the device dies that have integrated circuits formed therein are packaged with other package components such as interposers, package substrates, device dies, printed circuit boards (PCBs), and the like. In some of the packages, the package components also need to be bonded to each other. For example, a device die may be bonded to an interposer, which is further bonded to a package substrate. The package substrate with the interposer and the device die bonded thereon may further be bonded to a PCB.

The bonding between the package components may be performed through flip-chip bonding, which may be metal-to-metal bonding or solder bonding. Reliable bonding methods are currently explored.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A package is provided in accordance with various embodiments. The variations of the embodiments are discussed. Throughout the various views and illustrative embodiments, like reference numbers are used to designate like elements.

Figure 1:
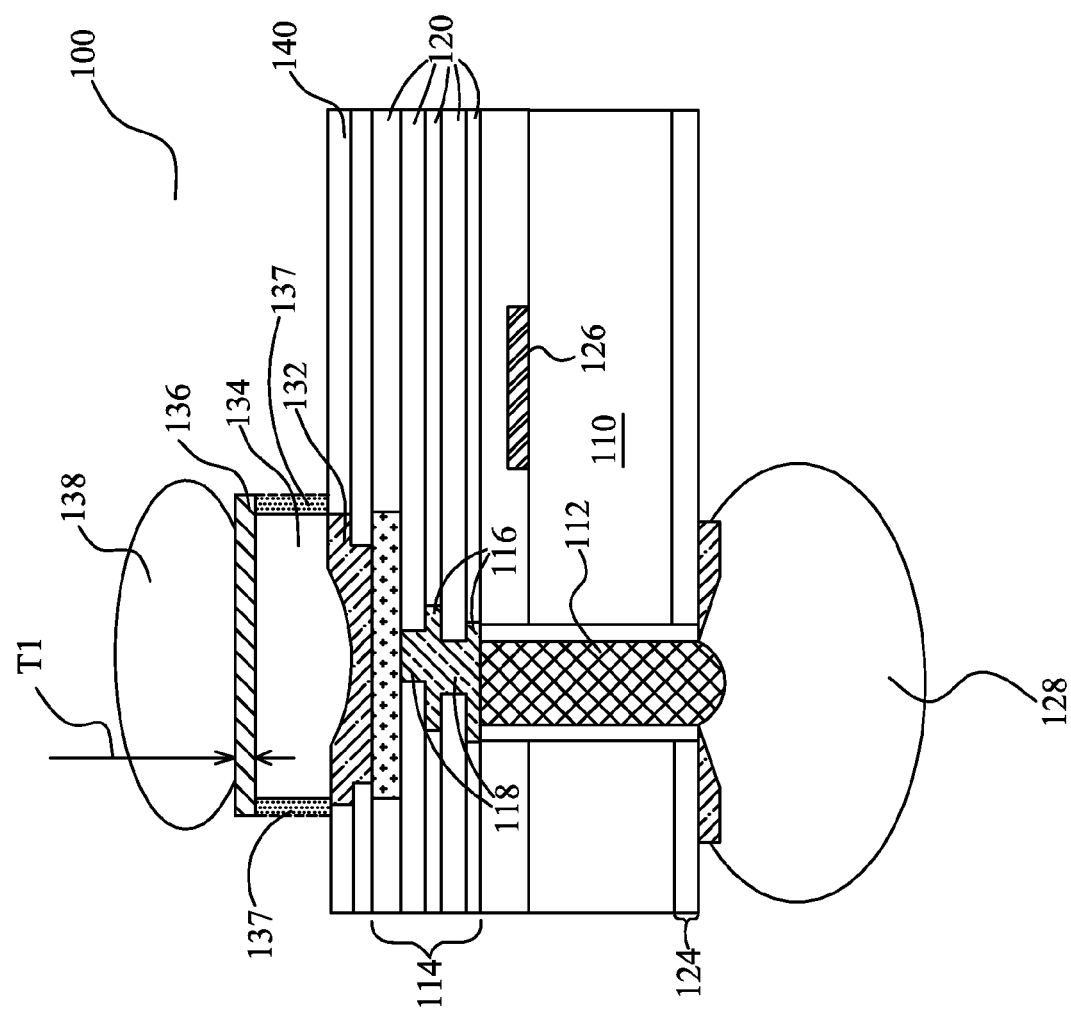
FIGS. 1 and 2 are cross-sectional views of package components in accordance with various embodiments.

FIG. 1 illustrates a cross-sectional view of package component 100. In an embodiment, package component 100 is an interposer. Alternatively, package component 100 may be a package substrate. Package component 100 may be used for making electrical connections from one side to the opposite side of package component 100. Package component 100 may include substrate 110, which may be a semiconductor substrate such as a silicon substrate. Alternatively, substrate 110 may be formed of a dielectric material, which may be an organic dielectric material. Through-via 112 is formed to penetrate through substrate 110. Although one through-via 112 is shown, package component 100 may include a plurality of through-vias similar to through-via 112.

Interconnect structure 114 is formed on a side of substrate 110. Throughout the description, the side of interconnect structure 114 having interconnect structure 114 is referred to as the front side, and the opposite side is referred to as the backside. Interconnect structure 114 includes metal lines/pads 116 and vias 118, which are electrically coupled to through-vias 112. Metal lines/pads 116 and vias 118 are formed in dielectric layers 120. On the backside of package component 100, an interconnect structure (not shown) may be formed, which may also comprise metal lines and vias similar to interconnect structure 114. Alternatively, the backside interconnect structure is not formed. Both the interconnect structure 114 and the backside interconnect structure are optional. Dielectric layer 124 may be formed on the backside of substrate 110 when substrate 110 is a semiconductor substrate. On the backside of package component 100, connector 128 is formed and electrically coupled to through-via 112. In some exemplary embodiments, connector 128 is a solder ball. In alternative embodiments, connector 128 may be a metal pad, a metal pillar, a metal pillar with a solder cap thereon, or the like.

Package component 100 may not include active devices such as transistors therein. In some embodiments, package component 100 is a passive component that includes passive devices 126, which may include resistors, capacitors, inductors, and/or the like. In alternative embodiments, package component 100 is free from both active devices and passive devices therein.

On the front top surface reside connector structures. One of connector structures may include under-bump-metallurgy (UBM) 132, which may be formed of a copper seed layer and a titanium layer under the copper seed layer, although other materials/layers may be used. Although FIG. 1 illustrates that UBM 132 is formed in top dielectric layer 140, UBM 132 may also include portions extend over the top surface of top dielectric layer 140 in addition to the portions extending into top dielectric layer 140. Metal pillar 134 is formed over and adjoining UBM 132. In some embodiments, metal pillar 134 is formed of copper, and hence is alternatively referred to as copper pillar 134 hereinafter, although other metals may be used to form metal pillar 134. The top surface of metal pillar 134 is over the top surface of top dielectric layer 140.

Diffusion barrier 136 is formed on the top surface of metal pillar 134, and may be formed of plating, for example. In accordance with some embodiments, diffusion barrier 136 is formed of an inert metal(s) that may act as a barrier for preventing the inter-diffusion of copper and solder. For example, diffusion barrier 136 may be formed of nickel. In some embodiments, sidewall protection layer 137 is formed on the sidewalls of metal pillar 134. In alternative embodiments, no sidewall protection layer 137 is formed. Sidewall protection layer 137 may be a composite layer including a plurality of layers formed of different materials, and may be electro-less nickel electro-less palladium immersion gold (ENEPIG), which includes a nickel layer, a palladium layer on the nickel layer, and a gold layer on the palladium layer. The gold layer may be formed using immersion plating. In other embodiments, protection layer 137 may be formed of other finish materials and methods, including, but not limited to, electro-less nickel immersion gold (ENIG), electro-less nickel electro-less gold (ENEG), immersion tin, immersion silver, or the like.

Diffusion barrier 136 may have thickness T1 greater than about 2 μm, and may act as an effective barrier for preventing the formation of inter-metal compound (IMC) that is formed between the solder in the overlying solder cap 138 and the copper in metal pillar 134. As a result, in the resulting package after package component 100 is bonded to package component 200 (FIG. 3), the IMC, if formed at all, has a minimized thickness, and the portion of metal pillar 134 consumed by the formation of IMC may be minimized.

Solder cap 138 is formed on the top surface of diffusion barrier 236, and may be formed of plating, for example. Solder cap 138 may be formed of a eutectic solder material. Alternatively, solder cap 138 may be a lead-free solder. Solder cap 138 may be reflowed to have a rounded surface. Alternatively, solder cap 138 may remain not reflowed, and hence may have a flat top surface.

Figure 2:
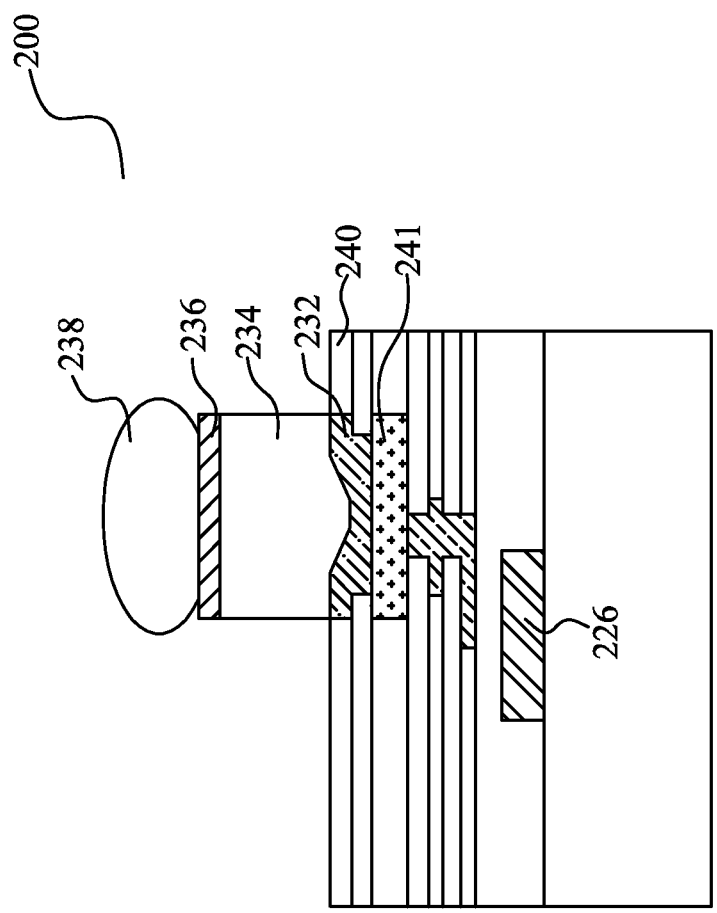

FIG. 2 illustrates a cross-sectional view of package component 200. In accordance with some embodiments, package component 200 is a device die, which may be a graphic die, a memory die, a core device die, or the like. Package component 200 may include active devices 226 such as transistors therein, or alternatively, comprise passive devices (also represented by feature 226) and free from active devices. Package component 200 may also include top dielectric layer 240, which may comprise a polymer such as polyimide. UBM 232 and metal pillar 234 may be formed, wherein UBM 232 may extend into top dielectric 240 to electrically couple to the underlying conductive features, for example, metal pad 241, which may be an aluminum pad or an aluminum copper pad. Although not shown, UBM 232 may include portions over and overlapping top dielectric layer 240. Metal pillar 234 is formed over, and may be in in contact with, UBM 232. Metal pillar 234 may be formed of copper or a copper alloy, although other type of metals may be used. Diffusion barrier 236 and solder cap 238 are also formed. The materials and the formation methods of UBM 232, metal pillar 234, diffusion barrier 236, and solder cap 238 may be essentially the same as the materials and the formation methods of UBM 132, metal pillar 134, diffusion barrier 136, and solder cap 138, respectively. The details of the 232, metal pillar 234, diffusion barrier 236, and solder cap 238 may thus be found referring to the respective components in package component 100.

Figure 3:
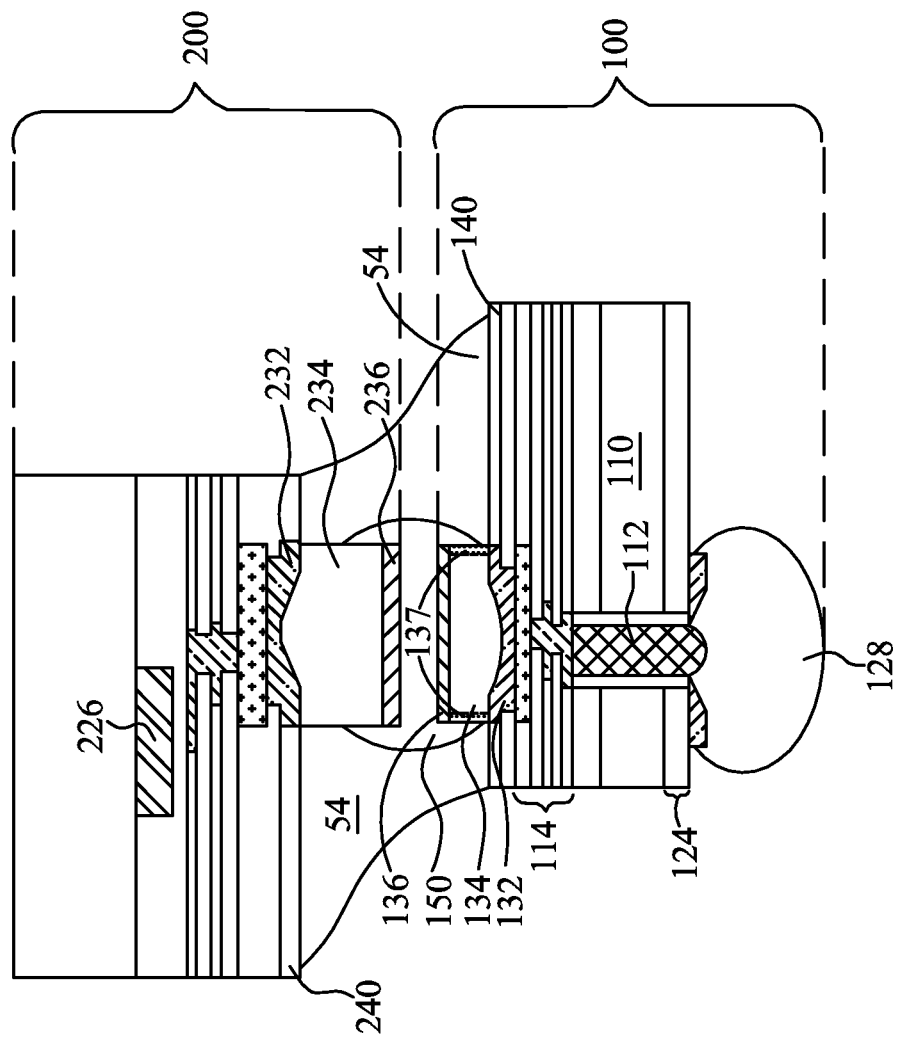
FIG. 3 illustrates the bonding of the package components in FIGS. 1 and 2.

FIG. 3 illustrates the bonding of package component 100 and 200. Solder cap 138 as in FIG. 1 is first put in contact with solder cap 238 in FIG. 2, and a reflow is performed to melt solder caps 138 and 238. As a result, solder caps 138 and 238 are joined to form solder region 150. Diffusion barrier 136 has good wetting ability for the molten solder, and the joint between diffusion barrier 136 and solder region 150 is reliable. Solder region 150 may extend to the sidewalls of metal pillars 134 and/or 234.

In the embodiments wherein no protection layer 137 is formed on the sidewalls of metal pillar 134 (FIG. 1), a flux is used to clean the sidewall surfaces of metal pillar 134, so that the surface metal oxide is removed, and the exposed sidewalls of metal pillar 134 have good wetting ability for the molten solder. As a result, the joint between metal pillar 134 and solder region 150 is also reliable. Alternatively, in the embodiments wherein protection layer 137 is formed on the sidewalls of metal pillar 134 (FIG. 1), solder region 150 may extend to physically contact protection layer 137, which has a good wetting ability. In order to make solder region 150 to contact the sidewalls of metal pillars 134/234 or protection layer 137, the amount of solder in solder caps 138 (FIG. 1) and 238 (FIG. 2) is controlled so that there is enough solder to be disposed to the sides of metal pillars 134/234.

FIG. 3 also illustrates underfill 54, which is dispensed between package components 100 and 200. Underfill 54 may be in physical contact with dielectrics 140 and 240 and solder region 150.

In accordance with embodiments, a package component is free from active devices therein. The package component includes a substrate, a through-via in the substrate, a top dielectric layer over the substrate, and a metal pillar having a top surface over a top surface of the top dielectric layer. The metal pillar is electrically coupled to the through-via. A diffusion barrier is over the top surface of the metal pillar. A solder cap is disposed over the diffusion barrier.

In accordance with other embodiments, a device includes an interposer bonded to a package component. The interposer include a substrate, a through-via in the substrate, a top dielectric layer over the substrate, a first metal pillar having a top surface over a top surface of the top dielectric layer, and a first diffusion barrier having a portion over the top surface of the first metal pillar. The package component includes a second top dielectric layer, a second metal pillar extending beyond the second top dielectric layer, a second diffusion barrier on a surface of the second metal pillar, and a solder region in contact with the first and the second diffusion barriers, The solder region extends on sidewalls of the first metal pillar.

In accordance with yet other embodiments, an interposer includes a substrate, a through-via in the substrate, a top dielectric layer over the substrate, a copper pillar having a top surface over a top surface of the top dielectric layer, and a diffusion barrier over and contacting the top surface of the copper pillar. The diffusion barrier comprises a non-copper metal. A solder cap is disposed over and contacting the diffusion barrier, wherein the solder cap is electrically coupled to the through-via.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method of forming a device comprising:
   forming a plurality of dielectric layers over a substrate;
   forming an under-bump-metallurgy (UBM) structure in a topmost dielectric layer of the plurality of dielectric layers;
   forming a first metal pillar over the substrate, the first metal pillar having a top surface disposed above a topmost dielectric layer disposed on the substrate, wherein the substrate has a through via disposed therein, wherein the first metal pillar is in electrical contact with the through via, and wherein the first metal pillar is formed over the UBM structure, and wherein the first metal pillar is in electrical contact with the through via through the UBM structure;

depositing a protection material on exposed sidewalls of the first metal pillar to form a protection layer on the sidewalls of the first metal pillar, the protection material comprising a first conductive material;

forming a first diffusion barrier layer over the top surface of the first metal pillar and over the protection layer, the first diffusion barrier layer being formed of a second material that is different than the first conductive material, the protection layer and the first diffusion barrier layer forming an interface therebetween; and forming a solder cap over the first diffusion barrier layer.

2. The method of claim 1, wherein a thickness of the first diffusion barrier layer is greater than about 2 μm.

3. The method of claim 1, wherein the first diffusion barrier layer comprises nickel.

4. The method of claim 1, wherein the first diffusion barrier layer does not extend on sidewalls of the first metal pillar.

5. The method of claim 1, wherein the first diffusion barrier layer contacts the top surface of the protection layer at the interface.

6. The method of claim 1, further comprising mounting a package component on the first metal pillar, the package component having a second metal pillar at a top surface of the package component and a second diffusion barrier layer on a top surface of the second metal pillar, wherein mounting the package component comprises bonding and electrically coupling the second diffusion barrier layer to the solder cap.

7. A method comprising:
forming an interposer, the forming the interposer comprising:
forming a first pillar having a top surface over a top surface of at least one dielectric layer, the at least one dielectric layer disposed over a substrate having a through via disposed therein;
forming an under-bump-metallurgy (UBM) structure in the topmost dielectric layer of the at least one dielectric layer, wherein the first pillar is formed over the UBM structure, and wherein the first pillar is in electrical contact with the through via through the UBM structure;
forming a protection layer on sidewalls of the first pillar, while leaving the top surface of the first pillar free of the protection layer; and
forming a first diffusion barrier layer over the top surface of the first pillar and extending over a top surface of the protection layer;
forming a solder region on the first diffusion barrier layer, wherein the solder region extends on the protection layer; and
mounting a package component to the interposer by bonding a second diffusion barrier layer of the package component to the solder region, the package component having a second pillar with the second diffusion barrier layer disposed thereon.

8. The method of claim 7, further comprising forming a plurality of dielectric layers over the substrate, the plurality of dielectric layers having a plurality of conductive elements disposed therein, wherein the first pillar is formed over a topmost dielectric layer of the plurality of dielectric layers, wherein the UBM structure is in electrical contact with the conductive elements, and wherein the first pillar is in electrical contact with the through via through the conductive elements.

9. The method of claim 7, wherein the package component is a device die comprising one or more active devices.

10. The method of claim 7, wherein the solder region extends onto the sidewalls of the second pillar.

11. The method of claim 7, wherein the first diffusion barrier layer has a thickness greater than about 2 μm.

12. The method of claim 7, wherein the first diffusion barrier layer contacts a top surface of the protection layer.

13. The method of claim 12, wherein the protection layer extends from a top surface of the at least one dielectric layer to a bottom surface of the first diffusion barrier layer.

14. A method of forming a device comprising:
providing an interposer having a substrate with a through via disposed therein, the interposer having a top dielectric layer disposed over the substrate at a first side of the interposer, wherein providing the interposer comprises:
forming a plurality of dielectric layers over the substrate and having a plurality of conductive elements disposed therein; and
forming an under-bump-metallurgy (UBM) structure in a topmost dielectric layer of the plurality of dielectric layers and in electrical contact with the conductive elements;
forming a copper pillar on the first side of the interposer and having a top surface higher than a top surface of the top dielectric layer;
forming a protection layer extending on sidewalls of the copper pillar, wherein the protection layer is a first material comprising a first non-copper metal;
forming a diffusion barrier layer over and physically contacting the top surface of the copper pillar, wherein the diffusion barrier layer is a second material comprising a second non-copper metal, wherein the second material is different from the first material; and
forming a solder cap over and contacting the diffusion barrier layer, wherein the solder cap is electrically coupled to the through via.

15. The method of claim 14, wherein the diffusion barrier layer has a thickness greater than about 2 μm.

16. The method of claim 14 further comprising forming an electrical connector on a second side of the interposer opposite the first side, and wherein the electrical connector is electrically coupled to the copper pillar.

17. The method of claim 14,
wherein the copper pillar is formed over UBM structure, and wherein the copper pillar is in electrical contact with the through via through the UBM structure and the conductive elements.

* * * * *